United States Patent
McBride

(10) Patent No.: US 6,301,691 B1
(45) Date of Patent: Oct. 9, 2001

(54) SYSTEM AND METHOD FOR DETECTING NFETS THAT PULL UP TO VDD AND PFETS THAT PULL DOWN TO GROUND

(75) Inventor: John G McBride, Ft Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/299,975

(22) Filed: Apr. 27, 1999

(51) Int. Cl.$^7$ .................................................. G06F 17/50
(52) U.S. Cl. .................................................. 716/5; 716/2
(58) Field of Search ...................... 716/5, 6, 8; 364/489, 364/488

(56) References Cited

U.S. PATENT DOCUMENTS

| | | | |
|---|---|---|---|
| 5,459,673 | * 10/1995 | Carmean et al. | 364/489 |
| 5,740,347 | * 4/1998 | Avidan | 395/183.09 |
| 5,880,967 | * 3/1999 | Jyu et al. | 364/489 |

* cited by examiner

Primary Examiner—David Nelms
Assistant Examiner—Thong Le

(57) ABSTRACT

In accordance with one aspect of the invention, a method identifies all NFETs that are impermissibly interposed in a pull up path. The method includes the steps of identifying an output node in a netlist file and identifying as pull-up paths all channel-paths extending between the output node and VDD. Then, the method evaluates every element along each of the identified pull-up paths to determine whether any element is an NFET, and generates an error message for any NFET identified along a pull-up path, if the NFET is neither channel connected to an interstitial pre-charge node nor a pass FET. In accordance with another aspect of the invention, a method identifies all PFETs that are impermissibly interposed between an output node and Ground. In accordance with this aspect, the method identifies an output node in a netlist file and identifies, as pull-down paths, all channel-paths extending between the output node and Ground. The method then evaluates every element along each of the identified pull-down paths to determine whether any element is an PFET. If so, the method generates an error message for any such PFET identified along a pull-down path, assuming that the PFET is not a pass FET.

25 Claims, 12 Drawing Sheets

SYSTEM AND METHOD FOR DETECTING NFETS THAT PULL UP TO VDD AND PFETS THAT PULL DOWN TO GROUND

BACKGROUND OF THE INVENTION

1. Field of the Invention

The present invention generally relates to computer-aided circuit design systems, and more particularly to a system and method for evaluating a netlist of an integrated circuit to detect NFETs that improperly pull up to VDD and PFETs that improperly pull down to Ground.

2. Discussion of the Related Art

Integrated circuits are electrical circuits comprised of transistors, resistors, capacitors, and other components on a single semiconductor "chip" in which the components are interconnected to perform a given function such as a microprocessor, programmable logic device (PLD), electrically erasable programmable memory (EEPROM), random access memory (RAM), operational amplifier, or voltage regulator. A circuit designer typically designs the integrated circuit by creating a circuit schematic indicating the electrical components and their interconnections. Often, designs are simulated by computer to verify functionality and ensure performance goals are satisfied.

In the world of electrical device engineering, the design and analysis work involved in producing electronic devices is often performed using electronic computer aided design (E-CAD) tools. As will be appreciated, electronic devices include electrical analog, digital, mixed hardware, optical, electro-mechanical, and a variety of other electrical devices. The design and the subsequent simulation of any circuit board, VLSI chip, or other electrical device via E-CAD tools allows a product to be thoroughly tested and often eliminates the need for building a prototype. Thus, today's sophisticated E-CAD tools may enable the circuit manufacturer to go directly to the manufacturing stage without costly, time consuming prototyping.

In order to perform the simulation and analysis of a hardware device, E-CAD tools must deal with an electronic representation of the hardware device. A "netlist" is one common representation of a hardware device. As will be appreciated by those skilled in the art of hardware device design, a "netlist" is a detailed circuit specification used by logic synthesizers, circuit simulators and other circuit design optimization tools. A netlist typically comprises a list of circuit components and the interconnections between those components.

The two forms of a netlist are the flat netlist and the hierarchical netlist. Often a netlist will contain a number of circuit "modules" which are used repetitively throughout the larger circuit. A flat netlist will contain multiple copies of the circuit modules essentially containing no boundary differentiation between the circuit modules and other components in the device. By way of analogy, one graphical representation of a flat netlist is simply the complete schematic of the circuit device.

In contrast, a hierarchical netlist will only maintain one copy of a circuit module which may be used in multiple locations. By way of analogy, one graphical representation of a hierarchical netlist would show the basic and/or non-repetitive devices in schematic form and the more complex and/or repetitive circuit modules would be represented by "black boxes." As will be appreciated by those skilled in the art, a black box is a system or component whose inputs, outputs, and general function are known, but whose contents are not shown. These "black box" representations, hereinafter called "modules", will mask the complexities therein, typically showing only input/output ports.

An integrated circuit design can be represented at different levels of abstraction, such as the Register-Transfer level (RTL) and the logic level, using a hardware description language (HDL). VHDL and Verilog are examples of HDL languages. At any abstraction level, an integrated circuit design is specified using behavioral or structural descriptions or a mix of both. At the logical level, the behavioral description is specified using boolean equations. The structural description is represented as a netlist of primitive cells. Examples of primitive cells are full-adders, NAND gates, latches, and D-Flip Flops.

Having set forth some very basic information regarding the representation of integrated circuits and other circuit schematics through netlists, systems are presently known that use the information provided in netlists to evaluate circuit timing and other related parameters. More specifically, systems are known that perform a timing analysis of circuits using netlist files. Although the operational specifics may vary from system to system, generally such systems operate by identifying certain critical timing paths, then evaluating the circuit to determine whether timing violations may occur through the critical paths. As is known, timing specifications may be provided to such systems by way of a configuration file.

One such system known in the prior art is marketed under the name PathMill, by EPIC Design Technology, Inc. (purchased by Synopsys). PathMill is a transistor-based analysis tool used to find critical paths and verify timing in semiconductor designs. Using static and mixed-level timing analysis, PathMill processes transistors, gates, and timing models. It also calculates timing delays, performs path searches, and checks timing requirements. As is known, PathMill can analyze combinational designs containing gates, and sequential designs containing gates, latches, flip-flops, and clocks. Combinational designs are generally measured through the longest and shortest paths.

While tools such as these are useful for the design verification process after layout, there are various shortcomings in the PathMill product and other similar products. For example, there is often a need to identify certain logic gates or particular combinations of logic gates. More specifically, there is often a need to identify combinations of gates that are configured in such a manner that may lead to operational uncertainty or performance problems.

By way of particular example, it is generally undesirable for circuit designers to design a circuit wherein a NFET is used in a pull-up path to VDD. Likewise it is generally undesirable for a circuit designer to utilize a PFET in a pull-down path to Ground. One exception, however, to this general design rule is for interstitial pre-charge nodes of a dynamic gate. That is, in an interstitial pre-charge gate a NFET may validly exist in a pull-up chain. Likewise, a PFET may validly exist in a pull-down chain, in an interstitial pre-charger.

Accordingly, it is generally desirable to identify and correct such circuit configurations during a circuit design phase, in order to obtain a higher quality circuit design.

SUMMARY OF THE INVENTION

Certain objects, advantages and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve the advantages and novel features, the present invention is generally directed to a system and method for identifying NFETs that are impermissibly interposed in a pull-up path. In accordance with one aspect of the invention, the method includes the steps of identifying an output node in a netlist file and identifying as pull-up paths all channel-paths extending between the output node and VDD. Then, the method evaluates every element along each of the identified pull-up paths to determine whether any element is an NFET, and generates an error message for any NFET identified along a pull-up path, if the NFET is neither channel connected to an interstitial pre-charge node nor a pass FET.

In accordance with another aspect of the invention, a method identifies all PFETs that are impermissibly interposed between an output node and Ground. In accordance with this aspect, the method identifies an output node in a netlist file and identifies, as pull-down paths, all channel-paths extending between the output node and Ground. The method then evaluates every element along each of the identified pull-down paths to determine whether any element is an PFET. If so, the method generates an error message for any such PFET identified along a pull-down path, assuming that the PFET is not a pass FET.

The step of generating an error message should be given an extremely broad interpretation, as the error message could comprise a wide variety of things. For example, it may entail generating a real time message that is displayed to a user. It may involve writing an error message into a file that may contain a listing of all errors or potential errors in a given circuit design being evaluated by the electrical rules checker. It may also entail simply setting a flag in some location (associated with the element), so that the element can later be readily identified as a potential error, simply by, for example, reading the pre-set flag.

In accordance with another aspect of the invention, and since the preferred embodiment of the present invention is implemented in software, a computer readable storage medium may be provided containing program code for identifying NFETs in a pull-up path. The computer readable storage medium may include a first code segment configured to identify an output node in a netlist file and a second code segment configured to identify, as pull-up paths, all channel-paths extending between the output node and VDD. The computer readable storage medium may also contain a third code segment configured to evaluate every element along each of the identified pull-up paths to determine whether any element is an NFET. Finally, the computer readable storage medium may contain a fourth code segment configured to generate an error message for any NFET identified along a pull-up path, if the NFET is not channel connected to an interstitial pre-charge node, and assuming the NFET is not configured as a pass gate.

In accordance with yet another aspect of the present invention, a computer readable storage medium may be provided containing program code for identifying PFETs in a pull-down path. The computer readable storage medium may include a first code segment configured to identify an output node in a netlist file and a second code segment configured to identify, as pull-down paths, all channel-paths extending between the output node and Ground. The computer readable storage medium may also contain a third code segment configured to evaluate every element along each of the identified pull-down paths to determine whether any element is an PFET. Finally, the computer readable storage medium may contain a fourth code segment configured to generate an error message for any PFET identified along a pull-down path, assuming the PFET is not configured as a pass gate.

DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE PREFERRED EMBODIMENT

Figure 1:
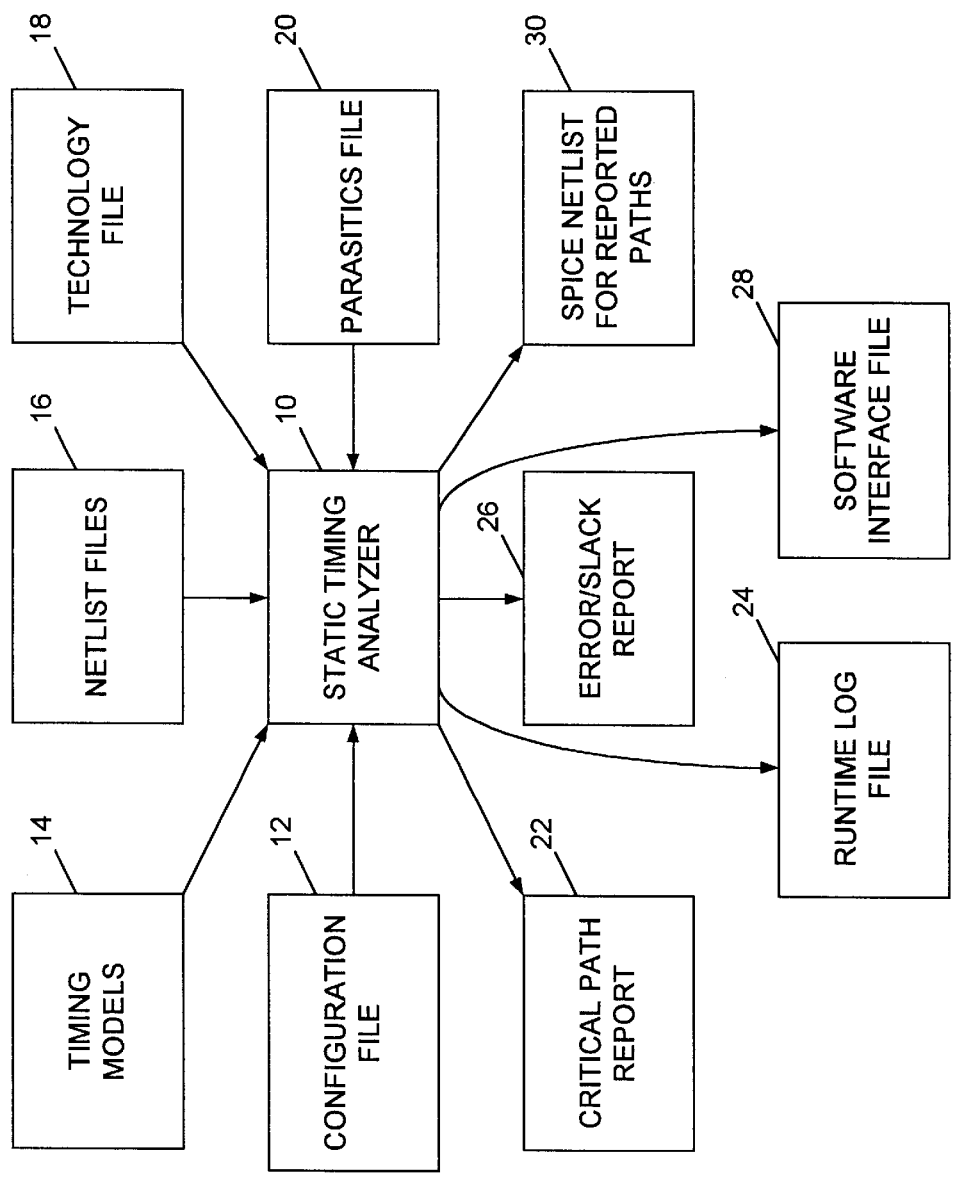
FIG. 1 is a block diagram of a static timing analyzer system, as is known in the prior art.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Referring now to the drawings, reference is made to FIG. 1, which is a block diagram of a prior art static timing analyzer program that illustrates the basic informational flow in such a system. Specifically, and as previously mentioned, one such system is marketed under the name PathMill. FIG. 1 is a diagram that illustrates the informational flow in the PathMill system. At the center of the diagram is a block denoted as static timing analyzer 10, which represents the PathMill program. Surrounding this block 10 are a number of other blocks that represent various input and output files and/or information.

More particularly, the PathMill program may utilize a configuration file 12, a file of timing models 14, one or more netlist files 16, a technology file 18, and a parasitic file 20, for various input information. In addition, the PathMill program may generate a number of different output files or other output information, including a critical path report 22, a runtime log file 24, an error report 26, a software interface file 28, and a SPICE netlist 30. When started, the PathMill program first processes the input netlist file(s) 16, the technology file 18, and the configuration file(s) 12. The information from these files is subsequently used for performing path analyses. Since the PathMill program is publicly available and marketed, its function and operation are well known, and therefore need not be discussed in detail herein.

For purposes of illustrating the present invention, much of the diagram and information illustrated in FIG. 1 is not shown in connection with the inventive system. In this regard, reference is made to FIG. 2, which shows one embodiment of a system constructed in accordance with the present invention. In the illustrated embodiment, only the static timing analyzer 10, the configuration file 12 and the netlist file 16 of FIG. 1 are shown. The configuration file(s) 12 contains information that informs the static timing analyzer 10 how to perform its analysis, and various numbers of configuration files may be used. The netlist file 16, as is known, defines the various integrated circuit components, and their interrelations.

Figure 2:
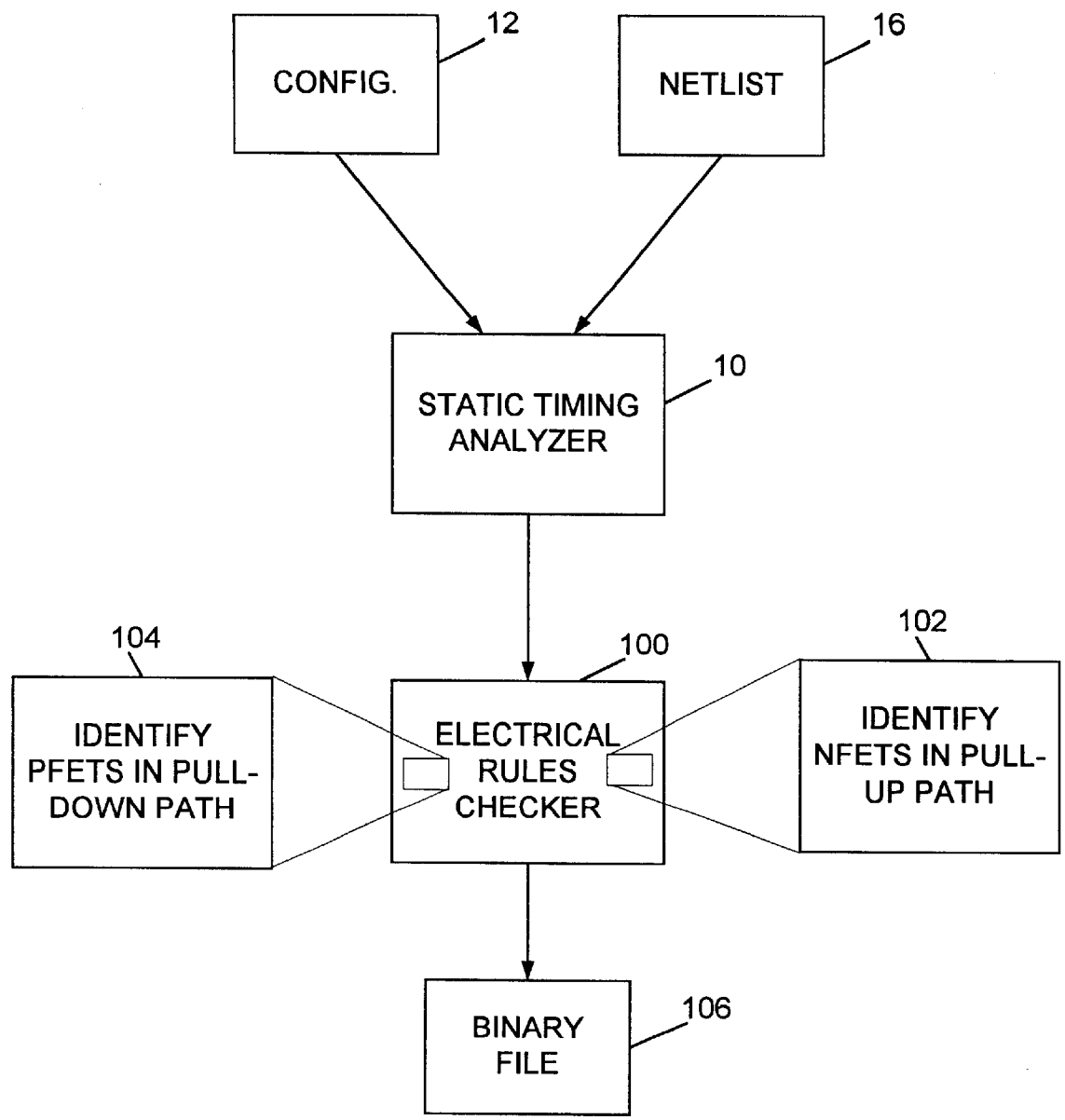
FIG. 2 is a block diagram illustrating the orientation of the electrical rules checking method of the present invention, in relation to an existing static timing analyzer.

The system shown in FIG. 2 preferably utilizes a computer (not shown) for its operation which runs the static timing analyzer program 10 and the electrical rules checker program 100. The computer may be electrically coupled to a memory device (not shown) which functions as a system storage unit for storing the code and data utilized and/or generated by the system. Those skilled in the art will realize that the present invention is not limited to any particular type of computer or memory device for performing these functions.

It should also be noted that the term "compute", as that term is used herein, is intended to denote any machine capable of performing the calculations, or computations, necessary to perform the tasks of the present invention. In essence, this includes any machine that is capable of accepting a structured input and of processing the input in accordance with prescribed rules to produce an output. Furthermore, those skilled in the art will understand that the system shown in FIG. 2 may be implemented in hardware, software, or a combination of both, and is not limited to any particular physical, structural, or electrical configuration.

The electrical rules checker 100 program of the present invention is preferably configured to operate on an output of the static timing analyzer 10. In this regard, the static timing analyzer may be configured to generate an output netlist database, which the electrical rules checker 100 of the present invention utilizes as an input. As previously mentioned, there are a wide variety of reasons why an electrical rules checking program may be desired. One such reason is to perform various checks over certain rules or strategies in an integrated circuit design. Such rules may vary from circuit to circuit, depending upon the particular application. For example, a portion 102 of the electrical rules checker program 100 operates to identify nodes that are susceptible to charge sharing. This is only one example of the multitude of checks which may be performed by the electrical rules checker program 100 of the present invention.

As is known, a large scale integrated circuit design is often done at the FET level. A designer may utilize thousands of interconnected FETs in designing a portion of an integrated circuit. Although the designer may make every effort to follow certain design guidelines, mistakes may nevertheless be made. Accordingly, the electrical rules checker 100 of the present invention provides an excellent mechanism for double-checking designs and design layouts. Furthermore, the electrical rules checker 100 of the present invention may generate an output binary file 106, which may ultimately be used in subsequent executions of the electrical rules checker 100.

However, prior to the electrical rules checker 100 of the present invention performing any of the rules checking tasks, a database of nodes and elements of the circuit to be evaluated is generated. This database is then utilized by the electrical rules checker 100 of the present invention to perform the rules checking tasks. However, it should be noted that the database and the method in which it is generated is not limited to use with any particular rules checker. They may be used with virtually any type of rules checker which evaluates nodes for design quality. For example, the database of the present invention may also be used with rules checkers which evaluate nodes for optical computing systems, mechanical systems and chemical systems. It will be apparent to those skilled in the art how data structures similar to those generated for elements and nodes in the electrical context may be generated in mechanical, chemical and optical computing contexts and used for rules checking in those contexts.

The manner in which this database is generated will now be discussed below with respect to FIGS. 3A–3C. For purposes of illustration, it will be assumed that the static timing analyzer 10, shown in FIG. 2 and discussed above, is the PathMill static timing analyzer, in order to provide an example of one possible implementation of the present invention. However, those skilled in the art will understand that the electrical rules checker 100 of the present invention and the database of the present invention are not limited to use with any particular program.

The PathMill static timing analyzer provides an application program interface (API) which allows the PathMill static timing analyzer to communicate with the electrical rules checker 100 of the present invention. This API allows code external to the PathMill program to be linked to the PathMill program so that the external code and the PathMill program itself comprise one executable which can be run as a single program. The electrical rules checker 100 of the present invention utilizes this API to obtain information from the PathMill static timing analyzer which can be utilized by the electrical rules checker 100 to generate a database, as well as identify NFETs in pull up paths 102 and identify PFETs in pull down paths 104, in accordance with the present invention.

Prior to the database of the present invention being generated, the PathMill program runs and identifies circuit characteristics of the circuit under consideration such as, for example, FET direction, node types, latches, dynamic gates, clocks, rise and fall times, etc. Before the PathMill program terminates, it calls the electrical rules checker 100 of the present invention. The PathMill program has a feature commonly referred to as "hooks", which allows the PathMill program to call routines at various stages of execution. Once the PathMill program has finished identifying the characteristics mentioned above, the PathMill program calls the electrical rules checker 100 of the present invention. The electrical rules checker 100 of the present invention, through this series of subroutine calls, creates its own database of the circuit under consideration.

Figure 3A:
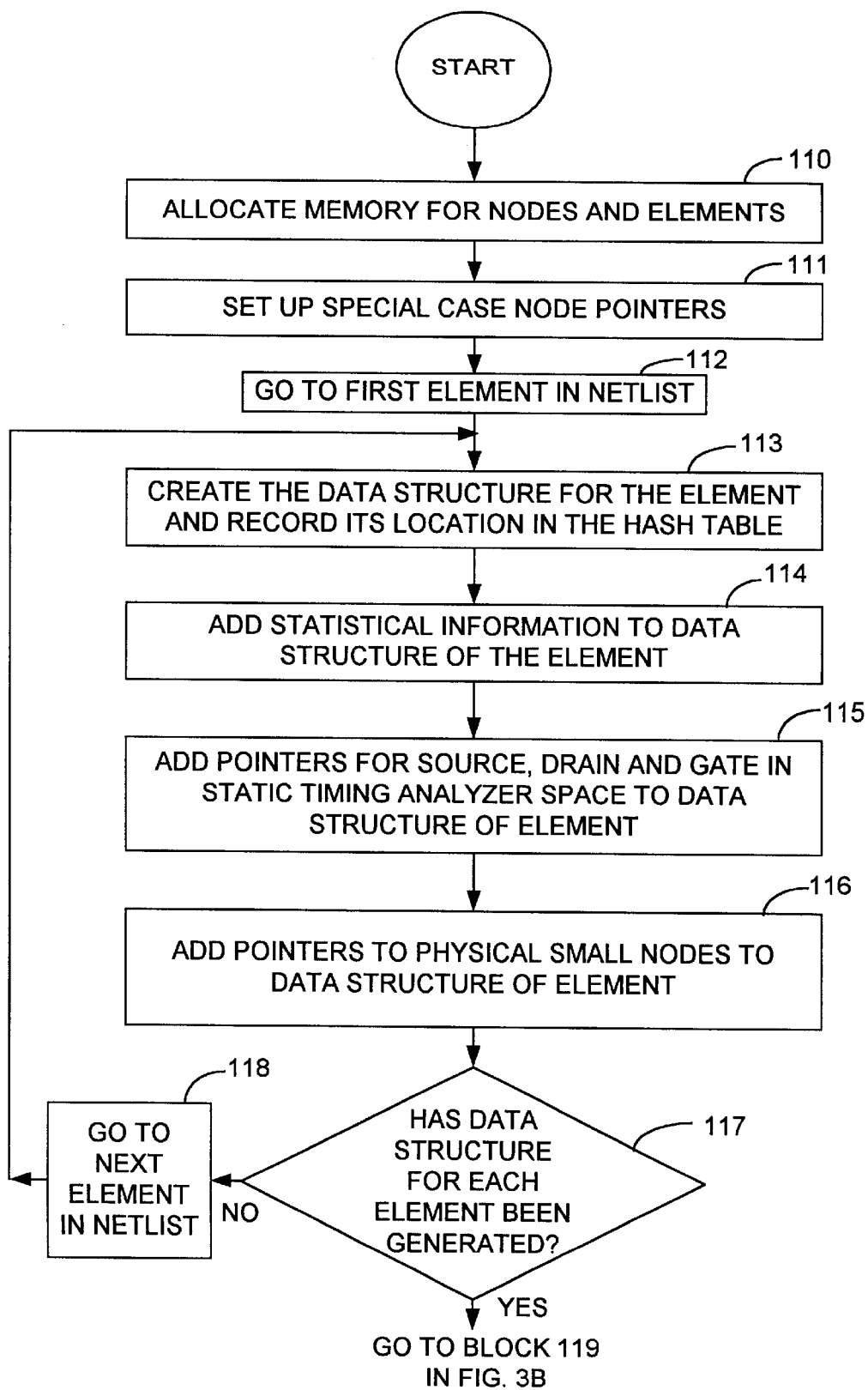
FIGS. 3A–3C collectively depict a flowchart that illustrates a process of generating a database of certain circuit element and node characteristics and properties that my be utilized by the preferred embodiment of the present invention to identify nodes susceptible to floating.
Figure 3B:
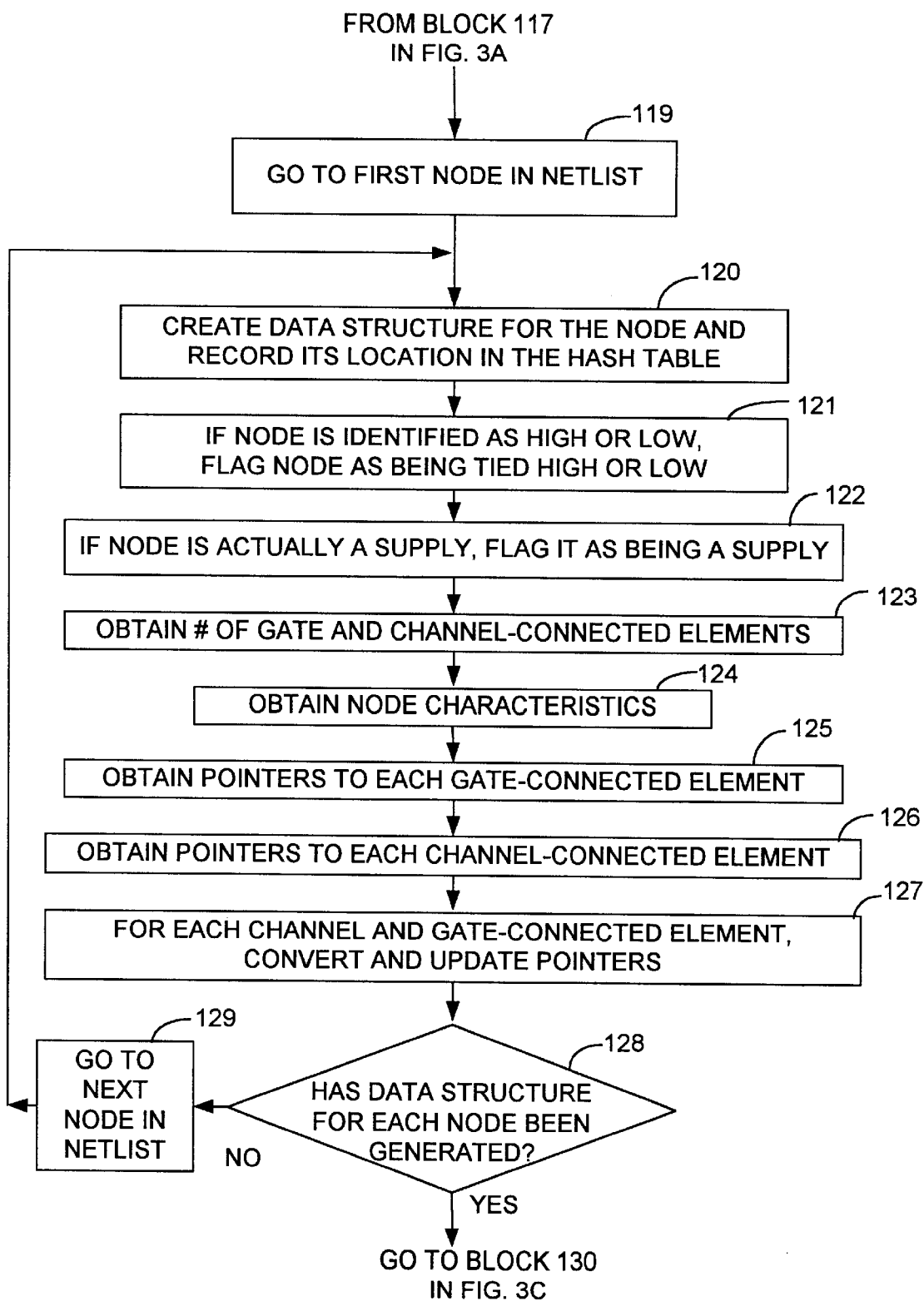

The first step in the process of generating the database is to allocate memory for the nodes and elements of the circuit, as indicated by block 110 in FIG. 3A. The PathMill program provides information via its API about the number of elements and nodes in the circuit of the electrical rules checker 100 and this information is utilized by the electrical rules checker 100 to perform memory allocation. Certain types of nodes and elements do not require as much information about their characteristics as do other types of nodes and elements. Therefore, the amount of memory allocated may vary for different types of nodes and elements. Rather than merely basing memory allocation on the number of nodes and elements in the circuit, it may be desirable to distinguish between different types of nodes and elements so that memory can be more efficiently allocated. However, it will be apparent to those skilled in the art that the present invention is not limited with respect to the manner in which memory space is allocated for the nodes and elements. Those skilled in the art will understand the manner in which the memory allocation task, and any optimizations of it, can be performed. Therefore, in the interest of brevity, a detailed discussion of the memory allocation task for the nodes and elements will not be provided herein.

Once memory has been allocated for the nodes and elements, the next step in the process of the present invention is to set up node pointers for special cases of nodes, as indicated by block 111. These special types of nodes will be used repeatedly during the process of generating the database, as discussed below in more detail. Therefore, the pointers for these nodes preferably are set up relatively early in the database generation process. For example, nodes which correspond to the supplies (GND and VDD) are special types of nodes and it is helpful to set up node pointers for these types of nodes. This is done by finding the nodes whose names match the known names of the supply nodes.

For each element, a data structure must be generated which can be utilized by the electrical rules checker 100 in performing the rules checking tasks. Steps 113–116 in FIG. 3A correspond to the steps for creating the element data structures. The first element for which a data structure must be generated is obtained during the step represented by block 112. The data structure for that element is then generated and the location of the data structure is recorded in a hash table, as indicated by block 113. This step is performed so that the element pointers into the space of the static timing analyzer can be used later to look up the element data structures in the space of the electrical rules checker 100. Hash tables and the manner in which they are utilized are well-known in the art. Therefore, a detailed discussion of the manner in which the pointers into the space of the static timing analyzer are converted using the hash table into pointers into the space of the electrical rules checker 100 will not be provided herein since persons skilled in the art will understand the manner in which this can be accomplished.

Statistical information relating to the element is then added to the data structure of the element, as indicated by block 114. This information includes, for example, the width of the element, the length of the element, the direction of the element, and the element type. Once the statistical information has been included in the data structure of the element, the pointers for the source, drain and gate of the element, as defined in the space of the static timing analyzer, are included in the data structure of the element, as indicated by block 115. The pointers that were set up in step 111 are utilized in step 115. If either the source, drain or gate of the element is attached to ground or VDD, then the pointers for the source, drain and gate are set to the pointers for ground or VDD obtained in step 111.

A circuit and the nodes of the circuit can be represented logically or physically, or as a combination of both. A logical representation of a circuit primarily comprises FETs and does not include any resistors for representing parasitic resistance of the interconnect material. The logical representation of a node is identified in the PathMill program as a "supernode". On the other hand, a physical representation of a node, which is identified in the PathMill program as a "small node", includes FETs, but also includes resistors, which correspond to the parasitic resistance in the node. Therefore, in the physical representation, a small node exists between the resistors representing the parasitic resistance and between any FET and any one of the resistors. In the physical representation, FETs may be connected to different small nodes whereas in the logical representation, those same FETs may be connected to the same supernode.

Each element has a pointer to a supernode and to a small node for each drain, source and gate. Therefore, there are six pointers for each FET. Each small node in the physical representation maps to one particular supernode in the logical representation. In block 116, the pointers corresponding to these small nodes are added to the data structure of the element. A determination is then made at block 117 as to whether or not data structures for all of the elements have been generated. If not, the next element in the netlist is obtained, as indicated by block 118, and the process returns to block 113. If so, the process proceeds to block 119 in FIG. 3B.

Once the data structures for the elements have been generated, the data structures for the nodes must be generated. Blocks 120–127 in FIG. 3B correspond to the steps in the process of the present invention for generating the data structures of the nodes. The first node for which the data structure is to be generated is obtained at the step represented by block 119. The data structure for the node is then generated and the location of the data structure is recorded in the hash table, as indicated by block 120.

For the purpose of design quality analysis, it is important to distinguish actual supply nodes, such as VDD and GND, from other circuit nodes which have been declared to be tied high or low for the purpose of timing or other analysis. In block 121, the rules checker 100 determines, through the use of PathMill API calls, which nodes have been declared to be tied high or low, or are actually high or low because they are actual supply nodes. The rules checker 100 flags the actual high nodes as high and the actual low nodes as low in the step represented by block 121. In the step represented by block 122, the nodes which are actually supplies are flagged as supplies in the database.

The electrical rules checker 100 then obtains the number of gate-connected elements and the number of channel-connected elements from the static timing analyzer, as indicated by block 123. The electrical rules checker 100 also obtains the characteristics of the nodes from the static timing analyzer 10, as indicated by block 124. These characteristics include, for example, capacitance, node type, rise and fall time, etc. Once the characteristics of the node have been obtained, the electrical rules checker 100 obtains the pointers provided by the static timing analyzer 10 that point to each gate-connected element, as indicated by block 125. The electrical rules checker 100 then obtains the pointers from the static timing analyzer which point to each channel-connected element, as indicated by block 126.

The element pointers that are stored in the node during the steps represented by blocks 125 and 126 are pointers into the space of the static timing analyzer. Similarly, the node pointers that are stored in the element during the step represented by block 115 are pointers into the space of the static timing analyzer, except that the pointers to the VDD and GND nodes are stored as pointers to the VDD and GND nodes in the space of the electrical rules checker 100. In the step represented by block 127, some of these pointers are converted to point to the elements and nodes in the space of the electrical rules checker 100. For each of the gate-connected and channel-connected elements of the current node, the following steps are performed, which are represented by block 127:

(1) the element pointer is converted to the corresponding element pointer into the space of the electrical rules checker 100 by looking it up in the hash table. This element pointer replaces the original element pointer in the node structure;

(2) the source, gate, and drain pointers in the element data structure are each checked to see if they point to the current node. If so, the node pointer (into the space of the static timing analyzer) is replaced with the pointer to the current node in the space of the electrical rules checker.

A determination is then made at block 128 as to whether or not data structures for all of the nodes have been generated. If not, the next node in the netlist is obtained, as indicated by block 129, and the process returns to block 120.

Figure 3C:
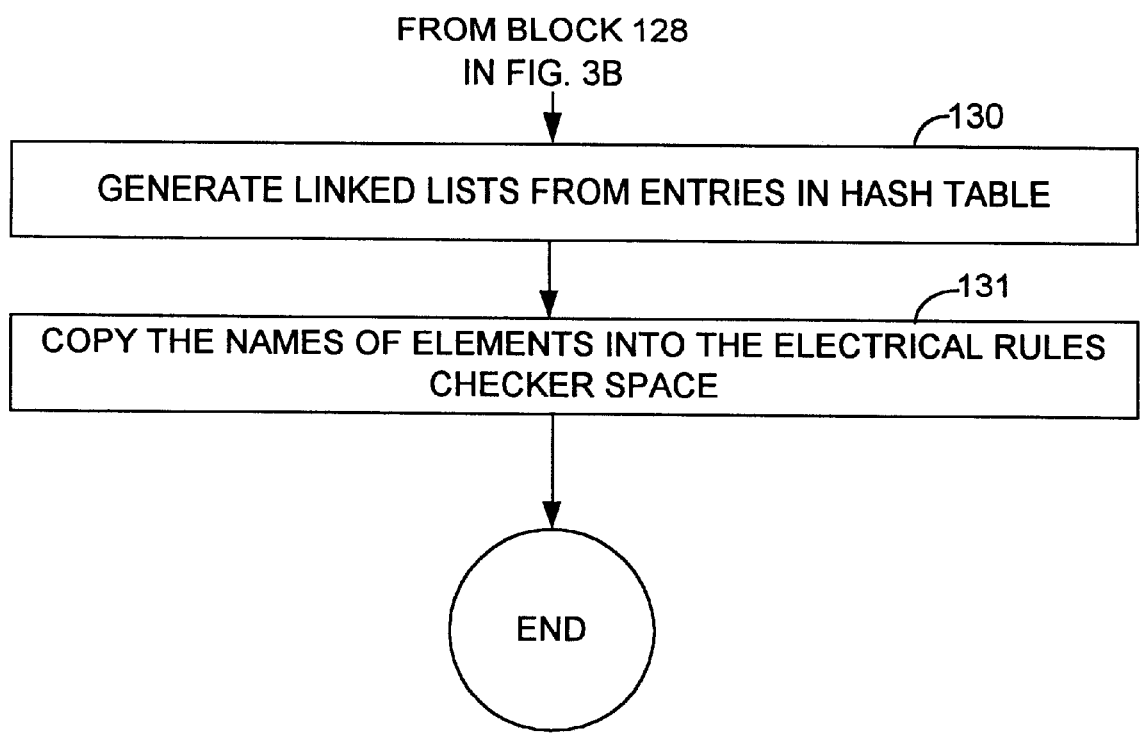

In order to enable the electrical rules checker 100 to maximize efficiency in searching the database of the present invention, once the data structures for all of the nodes have been created, linked lists of elements and nodes are generated from the entries in the hash table, as indicated by block 130 in FIG. 3C. These lists are used by the electrical rules checker 100 of the present invention in searching for an element in the database of the present invention. When searching for an element, the electrical rules checker 100 simply analyzes the elements contained in the linked list.

It should be noted that the arrangement of the elements and nodes in the linked lists may or may not have any physical relationship to the arrangement of the elements and nodes in the circuit under consideration. Thus, the linked lists are merely used to search through the elements and nodes stored in the database.

Once the linked lists have been generated, the names of the elements and nodes contained in the linked list are copied into electrical rules checker space, as indicated by block 131. This reduces the number of calls that need to be made to the PathMill program by the electrical rules checker 100. Once the database of the present invention has been generated, no more calls have to be made to the PathMill program via the PathMill API. The database of the present invention is comprised as the binary file 106 shown in FIG. 2.

Once the database of the present invention has been generated in the manner described above, the electrical rules checker 100 of the present invention utilizes this database to perform the rules checking tasks. As previously mentioned, one such task, and the one performed by the present invention is the identification of FETs that are impermissibly interposed between an output node and a supply. Specifically, the present invention detects NFETs that are impermissibly interposed along a pull up path (i.e., between an output node and VDD) and PFETs that are impermissibly interposed along a pull down path (i.e., between an output node and Ground).

Figure 4A:
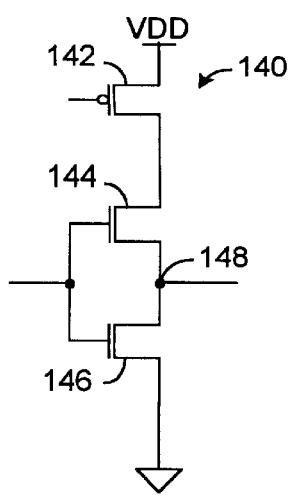
FIG. 4A is a schematic diagram of a circuit having a NFET in a pull up path.
Figure 4B:
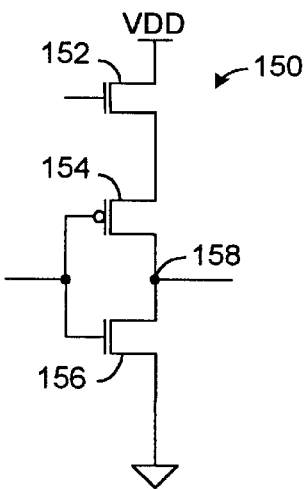
FIG. 4B is a schematic diagram of an alternative circuit having a NFET in a pull up path.
Figure 4C:
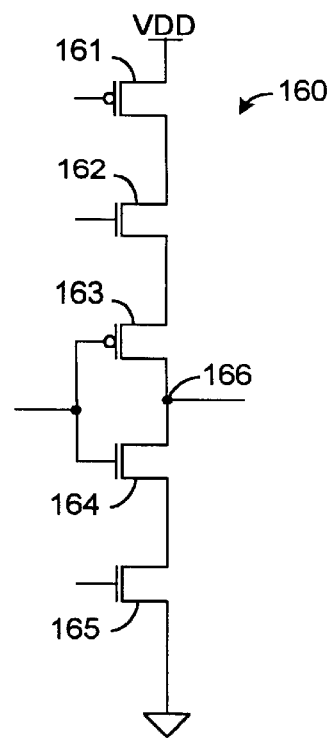
FIG. 4C is a schematic diagram of an alternative circuit having a NFET in a pull up path.

In this regard, reference is made to FIGS. 4A–4C, which illustrate the differing circuit configurations having a NFET improperly positioned or disposed within a pull up path. As shown in FIG. 4A, a circuit 140 is shown having a plurality of FET devices that are illustrated as being series connected between VDD and Ground. More specifically, a PFET 142 is series connected with two NFETs 144 and 146. An output node 148 is also illustrated. In the preferred embodiment of the present invention, a method operates by first identifying an output node, such as node 148. From this node, a pull up path exists between the output node 148 and VDD. Also, a pull down path exists between the output node 148 and ground. In a manner that will be further described below, the present invention will identity NFET 144 as being improperly positioned within a pull up path.

Similarly, FIG. 4B illustrates a circuit 150 having a plurality of FET devices that are series connected between VDD and ground. These include NFET 152, PFET 154, and NFET 156. An output node 158 exists between PFET 154 and NFET 156. As described in connection with FIG. 4A, the circuit defines a pull up path extending from the output node 158 to VDD and a pull down path extending from the output node 158 to ground. The present invention identifies NFET 152 as being improperly positioned within a pull up path. As illustrated between the two drawings of FIGS. 4A and 4B, an improperly positioned NFET device need not be adjacent VDD. In this regard, FIG. 4A illustrates the improperly positioned NFET as being separated from the VDD by PFET 142.

In addition, and as will be further described herein, the system and method of the present invention will identify improperly positioned NETs, in much more complicated structures. By way of illustration, reference is now made to FIG. 4C, which illustrates a circuit 160 comprising a plurality of series connected FET devices. More particularly, the devices include PFET 161, NFET 162, PFET 163, NFET 164, and NFET 165. As further illustrated, an output node 166 is positioned between PFET 163 and NFET 164. The system and method of the present invention identifies, from the structure, NET 162 as being improperly positioned within a pull up path.

In operation, the system and method of the present invention evaluates every node within a netlist file. The system and method of the invention begins by identifying output nodes. If a given node under evaluation is not identified as an output node, then the inventive method may move on to evaluate another node within the netlist. Further, and as will be appreciated by persons skilled in the art, a node may be readily identified as an output node from either the netlist file or other output that is generated by PathMill, or some other equivalent software routine.

For each output node identified, the present invention then identifies each pull up path as well as each pull down path. The inventive method then individually evaluates each element along each identified pull up path, and each element along each identified pull down path. Specifically, for each element identified within a pull up path, the system and method determines whether the element is an NFET. If so, then the inventive method may generate an error message indicating that the identified NFET is improperly positioned within a pull up path. This feature, however, is subject to one exception. Specifically, if the inventive method identifies the NFET as being part of an interstitial pre-charger, then the error message will not be generated. Interstitial pre-chargers, and the identification of same, will be further described in connection with FIG. 6.

Figure 5A:
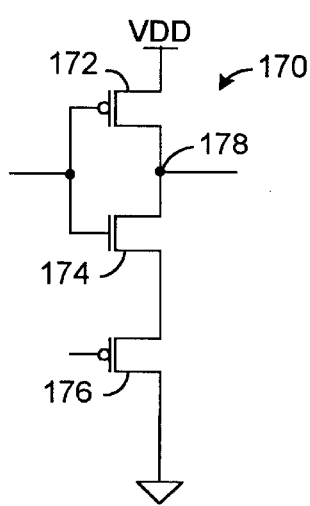
FIG. 5A is a schematic diagram of a circuit having a PFET in a pull down path.
Figure 5B:
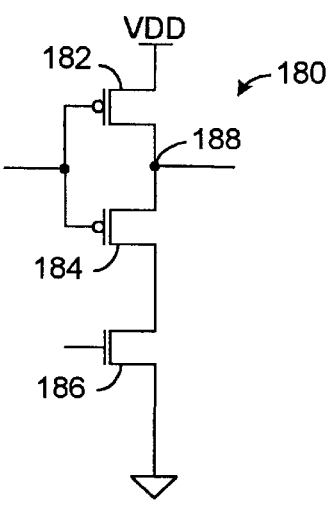
FIG. 5B is a schematic diagram of an alternative circuit having a PFET in a pull down path.
Figure 5C:
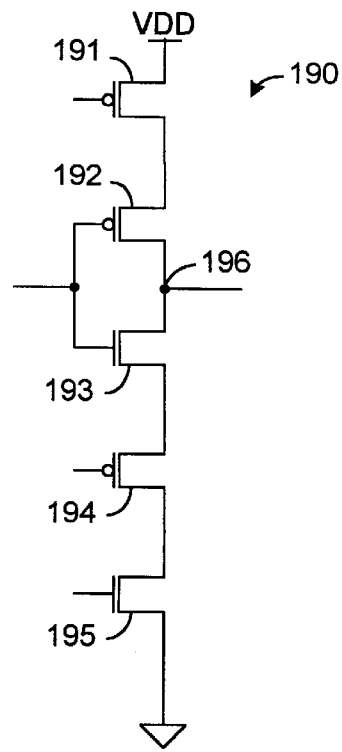
FIG. 5C is a schematic diagram of an alternative circuit having an NFET in a pull down path.

Having illustrated certain improper or invalid NFET configurations, reference is now made to FIGS. 5A–5C, which illustrates various circuit configurations having PFETs improperly positioned within a pull down path. For example, circuit 170 includes three FET devices that are channel connected between VDD and ground. These include PFET 172, NFET 174, and PFET 176. An output node 178 is also illustrated. As previously described, the present invention begins by identifying output nodes. Assuming output node 178 has been identified for evaluation, then the invention identifies the pullup path extending between the output node 178 and VDD. It also identifies the pull down path extending between the output node 178 and ground. In accordance with one aspect of the inventive method, the present invention evaluates each element along the pull down path, including NET 174 and PFET 176. In making this evaluation, the present invention identifies PFET 176 as being improperly disposed within a pull down path.

Similarly, FIG. 5B illustrates a circuit 180 having three series connected FET devices. These include PFET 182, PFET 184, and NFET 186. An output node 188 is also illustrated. In accordance with the invention, PFET 184 be identified as being improperly disposed between output node 188 and ground.

In a more complex configuration, FIG. 5C illustrates a circuit 190 having additional series connected FET devices. Specifically, PFET 191, PFET 192, NFET 193, PFET 194, and NFET 195 are all series connected between VDD and ground. An output node 196 is also illustrated. The system and method of the present invention will analyze the circuit 190 and identify PFET 191 and PFET 190 to as being within a pull up path, and NFET 193, PFET 194, and NFET 195 as being within a pull down path. Since PFETs may be legitimately disposed within a pull up path, the system and method of the present invention will not flag PFET 191 or PFET 192 as being improperly configured. The inventive system will, however, identify PFET 194 as being improperly disposed within a pull down path.

Although not specifically discussed above, if an NFET in a pull up path or a PFET in a pull down path are identified to be pass FETs, then they are not deemed to be impermissibly interposed between an output node and a supply. That is, a FET that is a pass FET is an exception to the general rule stated above, and no error is generated. In this regard, the preferred embodiment of the present invention may simply evaluate a data structure of a given element to determine whether the element is a pass FET. Preferably, during the creation of the database of elements (described in connection with FIGS. 3A–3C) a flag is set for each element within a netlist if that element is a pass FET. Thus, the inventive method may simply evaluate that pre-set flag to make the determination at a later time.

Figure 6:
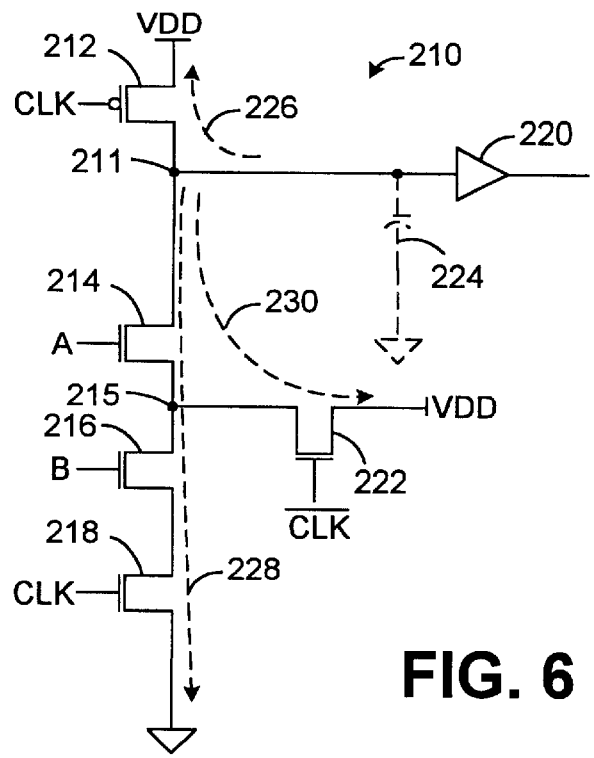
FIG. 6 is a schematic diagram of a circuit including an interstitial pre-charger.

Reference is now made to FIG. 6, which illustrates a circuit 210 of slightly higher complexity. As will be further described below, the circuit 210 includes a number of FET devices surrounding an output node 211. The circuit 210 more particularly includes PFET 212, NFET 214, NFET 216, and NFET 218 series connected between VDD and ground. It also includes NFET 222 interconnected between node 215 and VDD. An output buffer 220 is also shown. In accordance with the preferred embodiment of the present invention, output node 211 will be identified as an output node. The method of the invention will identify pull up paths 226 and 230. It will also identify pull down path 228.

In accordance with the preferred method, PFET 212 will be identified as a permissible FET device along a pull up path (i.e., no warning generated), and NFETs 214, 216, and 218 will be identified as permissible NET devices disposed along a pull down path. However, NFET 222 may initially be identified as an invalid NFET device disposed along a pull up path. In accordance with the preferred embodiment, the system and method will identify NFET 222 has being part of an interstitial pre-charger. Accordingly, the invention will recognize NFET 222 as being an exception to the general rule that NFET devices are impermissible in a pull up path. Accordingly, no error message or warning will be generated in connection with NFET 222.

As will be appreciated by those skilled in the art, if pull up path 230 is removed from the circuit 210, certain problems may arise, due to charge sharing. Assume node 211 is an output node of a dynamic gate (for example, a domino gate), with a clock signal applied to both PFET 212 and NFET 218. Due to parasitic and other capacitances (illustrated by a capacitor 224 in dash line), charge sharing may occur between output node 211 and node 215. Pre-charging is accomplished by using a clock to pre-charge the output node 211. Specifically, the gate pre-charge is when the clock signal is low. During this time period, one side (node 211) of PFET 212 is low, while the other side is at VDD. When the clock signal goes high, PFET 212 should turn on, allowing output node 211 to go high. However, due to the capacitance 224, node 211 charge shares with node 215. As a result, there is a droop in the signal applied at node 211.

Accordingly, NFET 222 may be inserted into the circuit 210 to pre-charge node 215. To configure a pre-charger, the static inverse of the clock signal is applied to the gate node of NFET 222. Therefore, when the clock signal is low, NFET 222 turns on, allowing node 215 to pre-charge to a logic high-level. Thereafter, when the clock signal goes high, PFET 212 turns on and NFET 222 turns off. Since node 215 has been pre-charged to a logic high state, node 211 charges to a logic high state at a much faster rate. Node 215 is known as an interstitial pre-charge node, and NFET 222 is identified at comprising a portion of an interstitial pre-charger.

For purposes of the system and method of the preferred embodiment, the general configuration of an output node surrounded by multiple pull up paths, wherein one of the pull up paths is driven by clock signal, and another of the pull up paths is driven by the static inverse of the clock signal, and wherein a NFET is identified in the pull up path that is driven by be static inverse of the clock signal, the system and method of the preferred embodiment will generate an error exception for that NFET device. In this regard, error exception refers to an exception to otherwise generating and error message.

Figure 7:
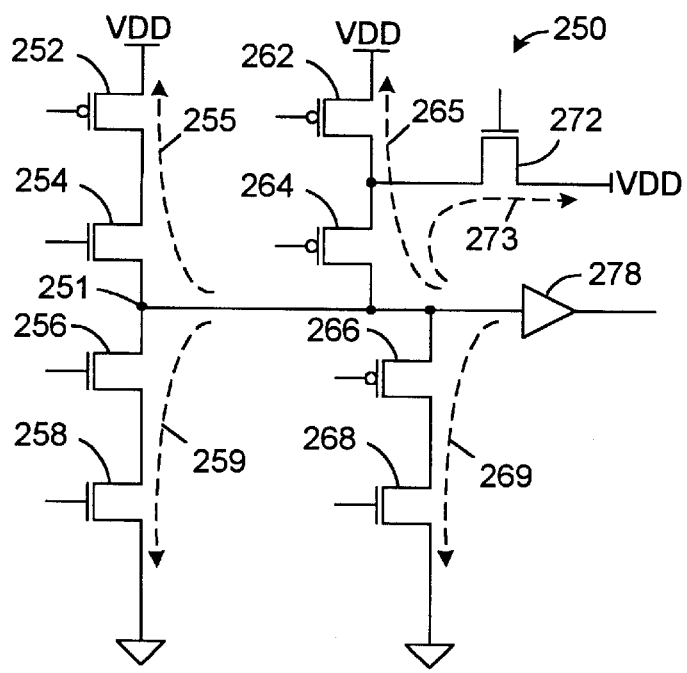
FIG. 7 is a schematic diagram of a circuit illustrating multiple pull up paths and multiple pull down paths.

To further illustrate the fundamental concepts of the present invention in the context of a slightly more complex circuit configuration, reference is made to FIG. 7, which shows a circuit 250 having a plurality of pull up paths and pull down paths surrounding output node 251. Accordingly, in a manner previously described, the system and method of the present invention may identify node 251 as being an output node. From that node, the system and method then identifies all pull up paths and all pull down paths. In the illustrated circuit, three pull up paths are identified: paths 255, 265, and 273. Also, two pull down paths are identified: path 259 and path 269. In accordance with a preferred embodiment, the method evaluates both elements 252 and 254 along pull up path 255, and identifies NFET 254 as being impermissibly disposed along a pull up path. The inventive method also evaluates the elements 262 and 264 along pull up path 265, and identifies no improper circuit configuration. The inventive method also identifies each element 264 and 272 along pull up path 273, and identifies NFET 272 as being impermissibly disposed along the pull up path. Similarly, the method of the preferred embodiment evaluates NFET 256 and 258 along pull down path 259, and identifies no impermissible circuit configuration. However, when the system and method evaluates PFET 266 and NFET 268 along pull down path 269, it identifies PFET 266 as being impermissibly disposed within a pull down path.

Figure 8:
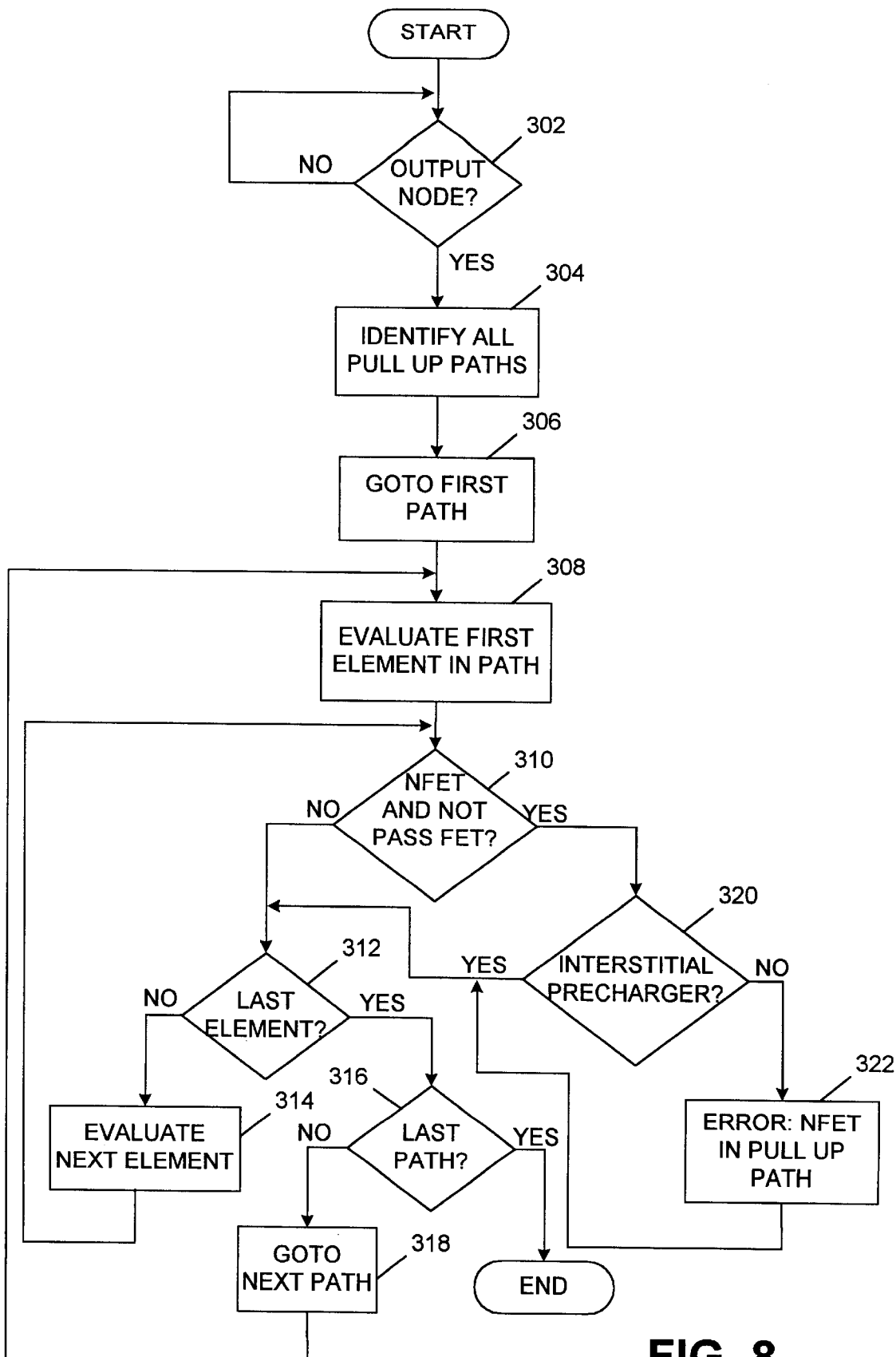
FIG. 8 is a flowchart illustrating a top-level functional operation of a system constructed in accordance with one aspect of the invention.
Figure 9:
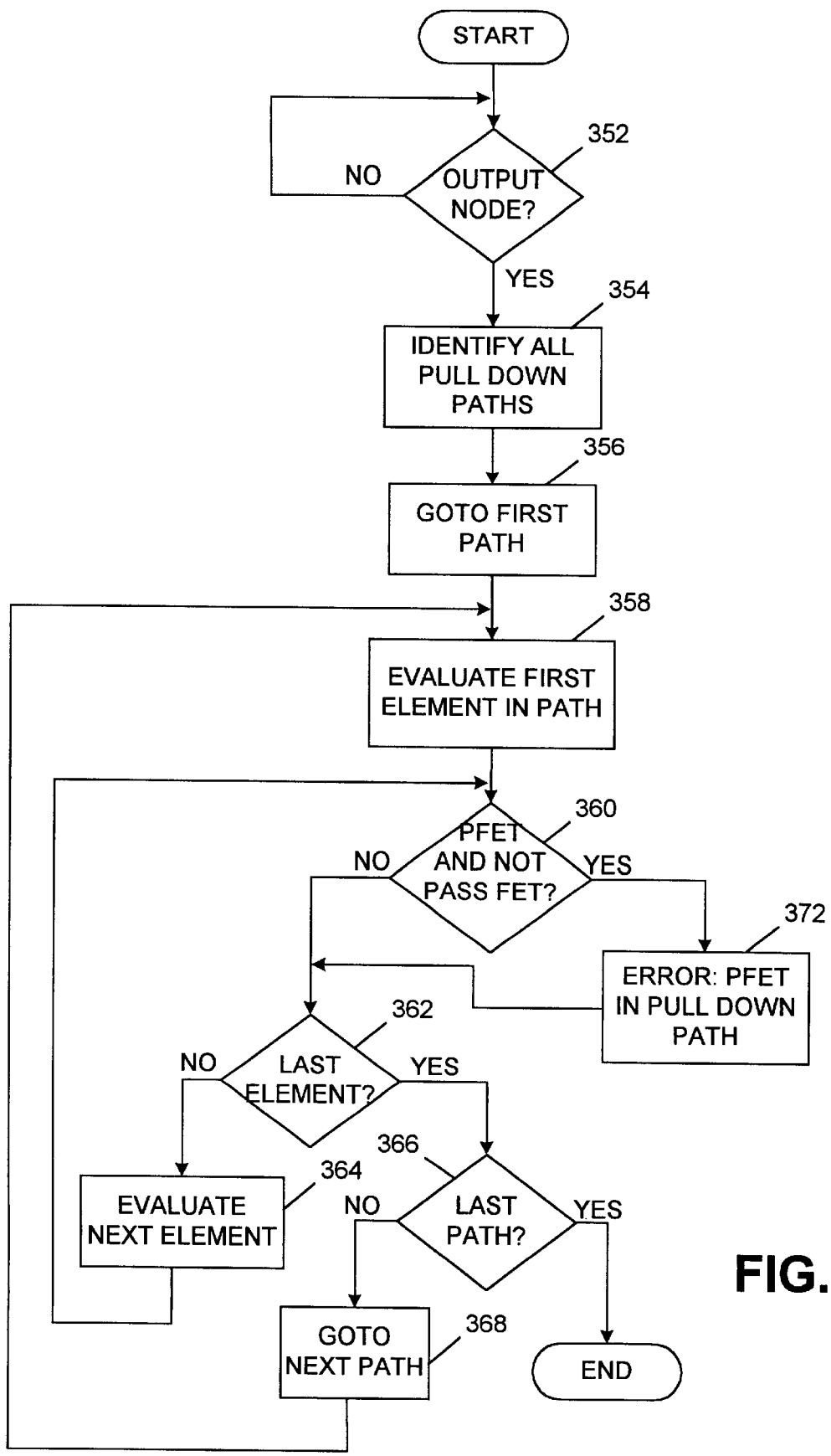
FIG. 9 is a flowchart illustrating a top-level functional operation of a system constructed in accordance with another aspect of the invention.

Having described both permissible and impermissible circuit configurations that are identified by the present invention, reference will now be made to the flowcharts of FIGS. 8–10. FIGS. 8 and 9 illustrate a path-based approach for identifying pull-up paths and pull-down paths. FIG. 10 illustrates a flowchart of an alternative embodiment, which illustrates a FET-based approach. Reference is first made to FIG. 8, which is a flowchart illustrating the top level functional operation of one aspect of the present invention; namely the identification of NFETs that are impermissibly interposed between an output node and VDD. In this regard, the method may begin by evaluating, one by one, every node in a netlist file. For each node, the method may evaluate whether a given node is an output node (step 302). If not, the method may proceed to another node. If so, then the method may evaluate (step 304) all channel connected elements, branching outwardly, to identify all pull up paths (all channel connected paths between the output node and VDD). Once all pull up paths have been identified, the method may evaluate each one for any impermissible NFETs.

The method may do so by proceeding to the first path (step 306) and evaluating the first element along that path (step 308), progressing from the output node toward VDD. Specifically, the method may evaluate whether the element is an NFET (step 310). If not, the method may then proceed to evaluate the next element (step 314), assuming that the element is not the last element in the current path (step 312). If the element was the last element in the current path, then the method may proceed by beginning to evaluate the next path (step 318), assuming that the current path is not the last path between the output node and VDD (step 316).

If the element is determined to be an NFET, assuming that it is not a pass FET (step 310), then the method may proceed to determine whether it is an NFET of an interstitial pre-charger (step 320). The method may make this determination in a variety of ways, consistent with the broader scope and aspects of the present invention, as described above in connection with FIG. 6. If the NFET is not part of an interstitial pre-charger, then the method may generate and report an appropriate error message for that element (step 322).

A similar method may be implemented for identifying PFETs that are impermissibly interposed between an output node and Ground. One significant difference, however, is that PFETs in a pull down path are not subject to the interstitial pre-charger exception that NFETs in a pull up path are. Accordingly, and as illustrated in FIG. 9, the method may begin by evaluating, one by one, every node in a netlist file. For each node, the method may evaluate whether a given node is an output node (step 352). If not, the method may proceed to another node. If so, then the method may evaluate (step 354) all channel connected elements, branching outwardly, to identify all pull down paths (all channel connected paths between the output node and Ground). Once all pull down paths have been identified, the method may evaluate each one for any impermissible PFETs.

The method may do so by proceeding to the first path (step 356) and evaluating the first element along that path (step 358), progressing from the output node toward Ground. Specifically, the method may evaluate whether the element is a PFET (step 360). If not, the method may then proceed to evaluate the next element (step 364), assuming that the element is not the last element in the current path (step 362). If the element was the last element in the current path, then the method may proceed by beginning to evaluate the next path (step 368), assuming that the current path is not the last path between the output node and Ground (step 366).

If the element is determined to be a PFET, assuming that it is not a pass FET (step 360), then the method may generate and report an appropriate error message for that element (step 372).

Figure 10A:
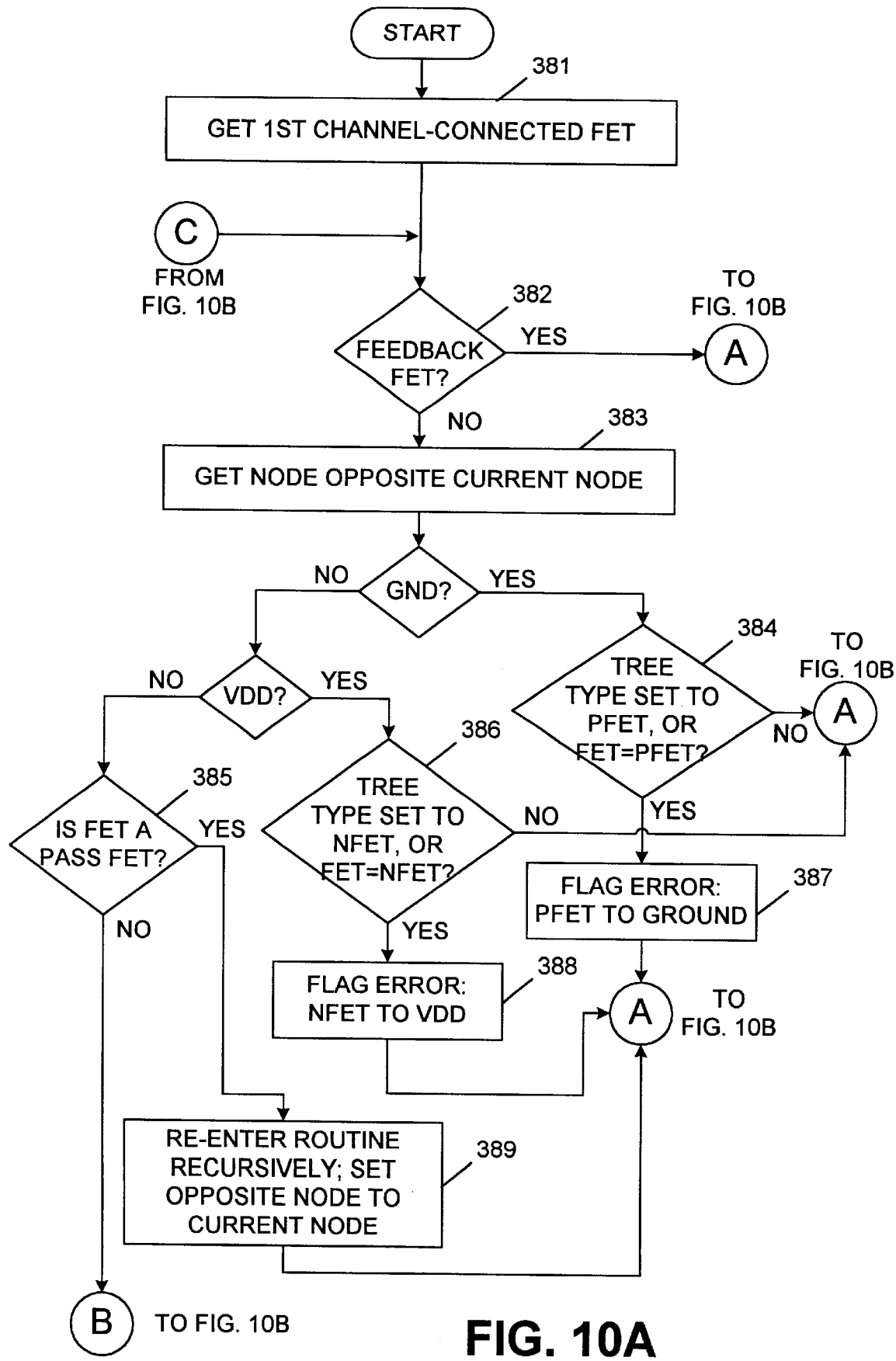
FIGS. 10A–10B collectively comprise a flowchart illustrating an alternative method for identifying pull-up and pull-down paths.
Figure 10B:
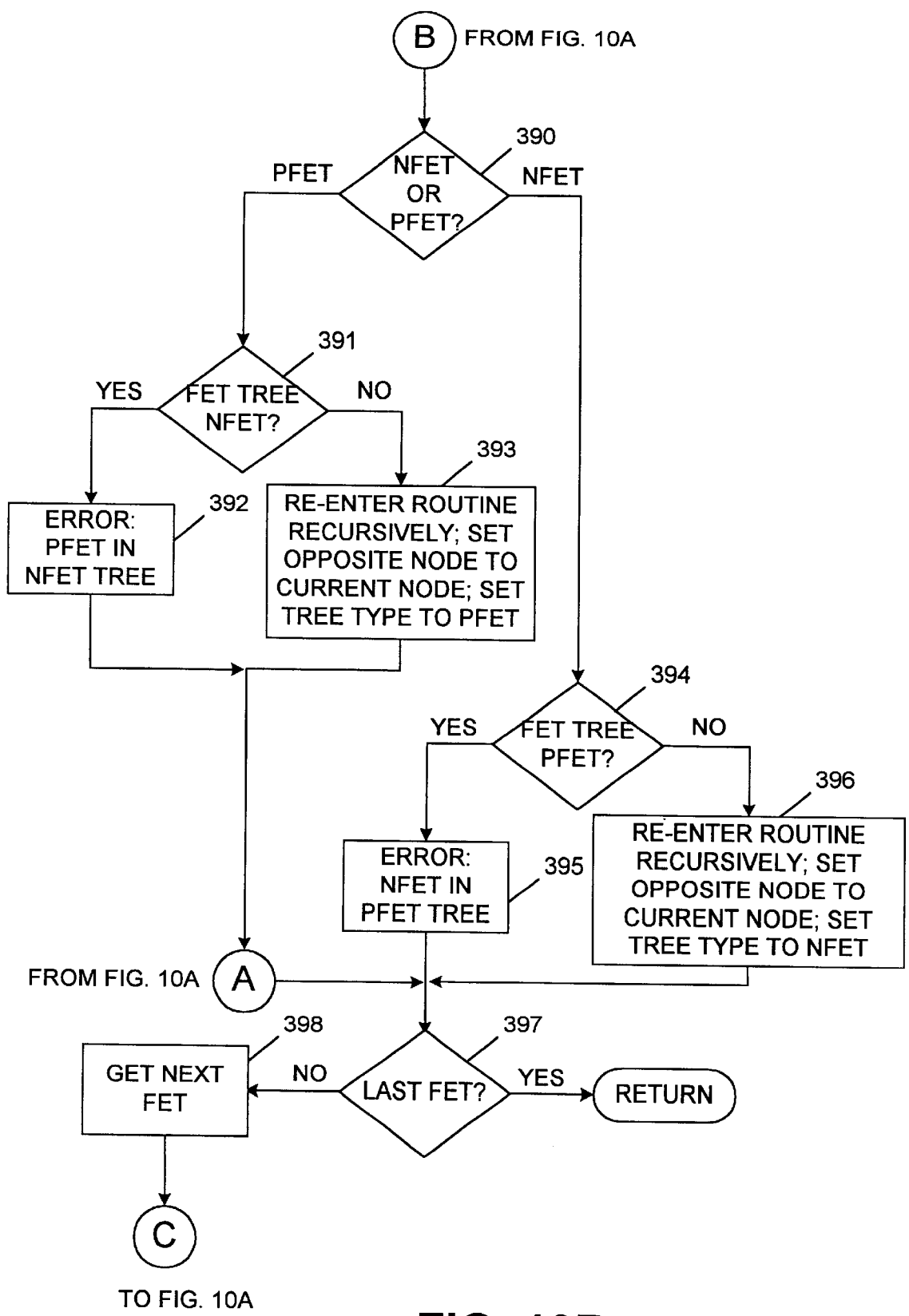

As previously mentioned, FIGS. 8 and 9 illustrate a path-based approach to identifying pull-up and pull-down paths. Reference is now made to FIGS. 10A and 10B, which collectively comprise a flowchart illustrating an alternative, FET-based approach. In this embodiment, the routine illustrated in FIGS. 10A and 10B may be recursively implemented. Specifically, the routine may be called from the following (pseudo-code) program flow for each output node in the netlist:

for each output node:

```
{
    Tree Type = UNSET;
    Call routine of FIGs. 10A and 10B;
    Return
}.
```

The "Tree Type" is a variable that, initially UNSET, will be set to either PFET or NFET, before re-entry (recursively) into the routine (see steps 393 and 396).

Specifically, upon calling the routine, the program obtains a first FET that is channel connected to a current output node (step 381). As previously mentioned, a chain of FETs extending between an output node and a supply (either VDD or ground) should all be the same type. More particularly, only PFETs should be channel connected (in series) between the output node and VDD, whereas only NFETs should be channel connected between the output node and ground.

In one embodiment, the program may also ignore feedback FETs. Accordingly, step 382 evaluates the current FET to determine whether it is a feedback FET. If so, then the program proceeds to steps 397 and 398, where it obtains the next FET, if any. If, however, the current FET is not a feedback FET, then the program proceeds to step 383, where it evaluates the node opposite the current node (i.e., the output node). The program then evaluates this opposite node to determine whether it is connected to VDD, ground, or an interim node.

If the node opposite the current node is connected to ground, then the program evaluates the Tree-Type variable to determine whether it is set to PFET (step 384), or whether the FET is a PFET. If not, no error condition is identified for this node, and the program may proceed to steps 397 and 398, where it obtains the next FET (that is channel connected to the output node) for evaluation, if any. If, however, the evaluation of step 384 determines that the Tree-Type variable is set to PFET, or if the FET is a PFET, then an error condition is identified and flagged for later reporting to the user (step 387). Specifically, the error condition is identified as one in which a PFET is connected to ground. Likewise, if the node opposite the current node is determined to be connected to VDD, then the program evaluates the Tree-Type variable to determine whether it is set to NET (step 386), or whether the current FET is a NFET. If not, then the program proceeds to steps 397 and 398, where it obtains the next FET that is channel connected to the output node, if any. If, however, the evaluation of step 386 determines that the Tree-Type variable is set to NFET, or if the FET is a NFET, then an error condition is identified and flagged (step 388). Specifically, this error condition identifies a NFET that is improperly connected to VDD.

If the node opposite the current node is neither connected to VDD nor ground, then the program evaluates the current FET to determine whether it is a pass FET (step 385). There are a variety of ways that this determination may be made, consistent with the broader concepts and teachings of the present invention, and which should be appreciated by those skilled in the heart. Accordingly, the methodology for carrying out this step need not be described herein. If the evaluation of step 385 determines that the current FET under evaluation is a pass FET, then the program reenters the routine of FIGS. 10A and 10B recursively (step 389). At this time, the program also sets the node opposite the current node to the new "current node."

If, however, the evaluation of step 385 determines that the current FET is not a pass FET, then it evaluates the FET to determine whether it is a NFET or a PFET (step 390). If the FET is determined to be a PFET, in the program evaluates whether the Tree-Type variable is set to NFET (step 391). If the evaluation of step 391 resolves to yes, then the program identifies an error condition of the PFET being nested within a NFET tree (step 392). If the evaluation of step 391 resolves to no, then the program reenters the routine recursively (step 393). At this time, the program also sets the node opposite the current node to the new "current node," and sets the Tree Type variable, if it is previously unset.

Alternatively, if the evaluation of step 390 determines the FET to be a PFET, then the program evaluates the Tree-Type variable to determine whether it is set to PFET (step 394). If so, the program identifies the error condition of a NFET being disposed within a PFET tree (step 395). Otherwise, the program reenters the routine recursively (step 396). At this time, the program also sets the node opposite the current node to the new "current node," and sets the Tree Type variable, if it is previously unset.

Thereafter, the program proceeds to step 397, where it determines whether the current FET is the last FET that is channel connected to the output node. If so, then the routine is complete. If not, then the program proceeds to step 398 where it obtains the next FET and returns to step 381.

Figure 11:
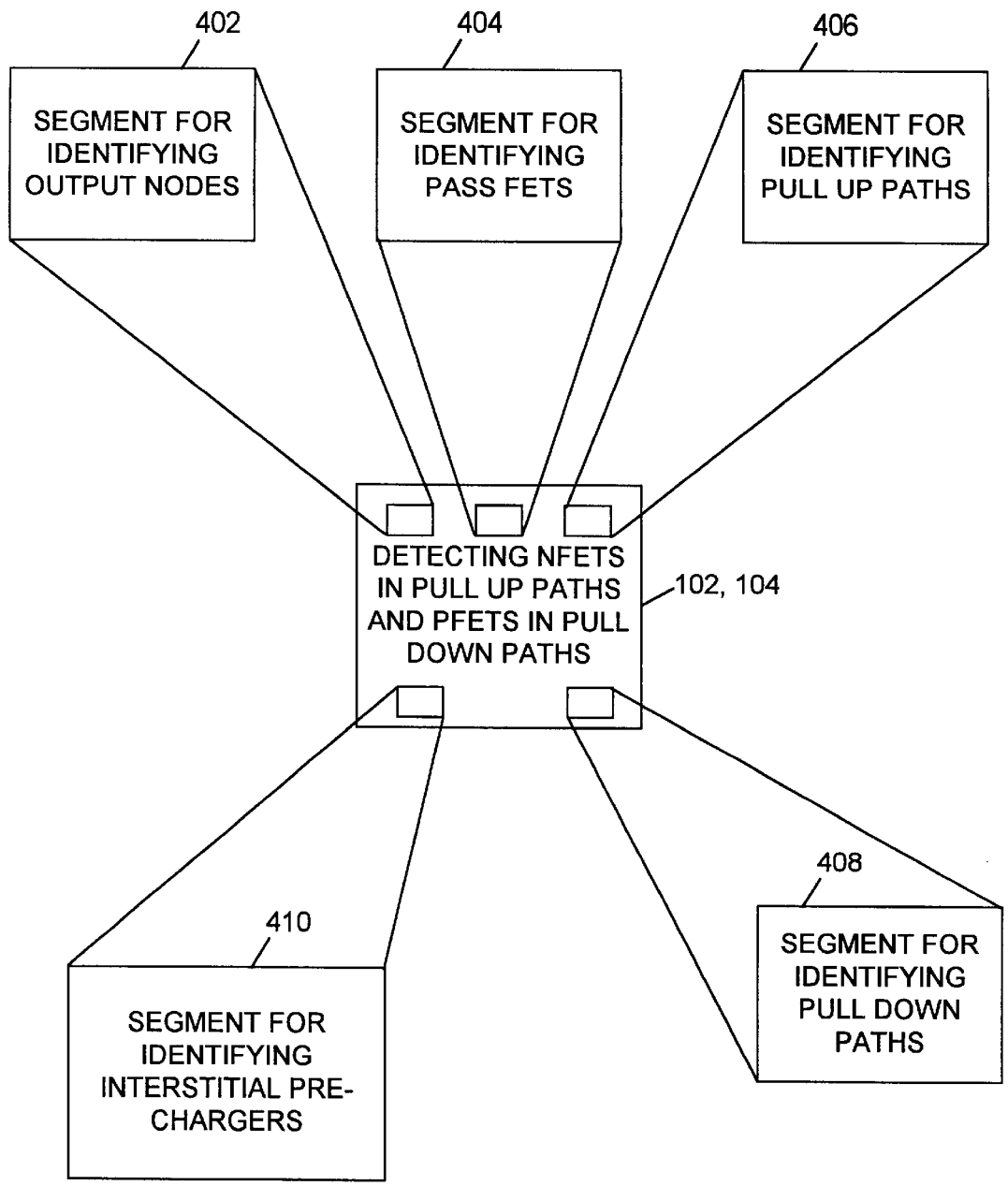
FIG. 11 is a block diagram illustrating certain fundamental code segments comprising a system constructed in accordance with the invention.

It will be appreciated that the steps illustrated in the flow charts of FIGS. 3A–3C, 8, 9, and 10 are provided for purposes of illustration and are not deemed to be limiting on the broader aspects of the present invention. Indeed, the broader aspects of the invention may be implemented using a variety of different approaches that are still consistent with the scope and content of the present invention. As illustrated in FIG. 2, a portion 102 of the electrical rules checker program 100 of the present invention is configured to detect NFETs that are impermissibly interposed within a pull up path. In addition, a portion 104 of the electrical rules checker program 100 is configured to detect PFETs that are impermissibly interposed within a pull down path. In the preferred embodiment, the system comprises software which may be provided on a computer readable storage medium in the form of code segments that are particularly configured to perform various functions. In this regard, reference is now made to FIG. 11 which illustrates certain functions which may be carried out by a system constructed in accordance with the teachings of the invention. For example, a first code segment 402 may be provided for identifying output nodes. Another segment 404 may be provided for identifying elements as pass FETs. Another segment 406 may be provided for identifying pull up paths. Still another segment 408 may be provided for identifying pull down paths. For example, one such segment may be provided for identifying FETs that are channel connected between a output node and a supply (e.g., NET to Ground or PFET to VDD). Yet another segment 410 may be provided for identifying interstitial pre-chargers.

It should be appreciated that the flow charts of FIGS. 3A–3C, 8, 9, and 10 show the top-level operation of only one possible implementation of the methods of the present invention. In this regard, each block represents a module, segment, or portion of code, which comprises one or more executable instructions for implementing the specified logical function(s). It should also be noted that in some alternative implementations, the functions noted in the blocks may occur out of the order noted in FIGS. 3A–3C, 8, 9, and 10. For example, two blocks shown in succession may in fact be executed substantially concurrently or the blocks may sometimes be executed in the reverse order, depending upon the functionality involved.

The foregoing description is not intended to be exhaustive or to limit the invention to the precise forms disclosed. Obvious modifications or variations are possible in light of the above teachings. In this regard, the embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A method for identifying NFETs in a pull-up path comprising the steps of:

identifying an output node in a netlist file;

identifying a channel path extending between the output node and a positive supply as a pull-up path;

evaluating an element along the identified pull-up path to determine whether the element is an NFET; and generating an error message, if the element is identified as an NFET that is not channel connected to an interstitial pre-charge node.

2. The method as defined in claim 1, wherein the step of generating an error message further includes the step of identifying a NFET as a NFET that is channel-connected to an interstitial pre-charge node.

3. The method as defined in claim 1, further including the step of identifying an interstitial pre-charge node.

4. The method as defined in claim 3, wherein the step of identifying an interstitial pre-charge node further includes the step of identifying a plurality of channel-connected NFETs extending between the output node and ground.

5. The method as defined in claim 4, wherein the step of identifying an interstitial pre-charge node further includes the step of identifying a PFET channel connected to VDD and also channel connected in series with the plurality of channel connected NFETs.

6. The method as defined in claim 5, further including the step of verifying that a clock signal drives the identified PFET and that a static inverse of the clock signal drives the identified NFET.

7. The method as defined in claim 5, further including the step of ensuring that at least one element separates the output node from the identified NFET.

8. The method as defined in claim 1, wherein the step of generating an error message further includes the step of ensuring that the element identified as an the NFET is not a pass FET.

9. The method as defined in claim 8, wherein the step of ensuring that the element defined as the NFET is not a pass FET further includes the step of evaluating a database having characteristics of a given element stored therein.

10. The method as defined in claim 1, wherein the step of step identifying an output node is more specifically performed by evaluating every node in a netlist and identifying every output node.

11. The method as defined in claim 1, wherein the step of evaluating an element along the identified pull-up path includes the step of evaluating a database having characteristics of a given element stored therein.

12. A method for identifying PFETs in a pull-down path comprising the steps of:
    identifying an output node in a netlist file;
    identifying a channel-path extending between the output node and a negative supply as a pull-down path;
    evaluating an element along the identified pull-down path to determine whether the element is a PFET; and
    generating an error message, if the element is identified as a PFET.

13. The method as defined in claim 12, wherein the step of generating an error message further includes the step of ensuring that the element identified as a PFET is not a pass FET.

14. The method as defined in claim 13, wherein the step of ensuring that the element identified as a PFET is not a pass FET further includes the step of evaluating a database having characteristics of a given element stored therein.

15. The method as defined in claim 12, wherein the step of step identifying an output node is more specifically performed by evaluating every node in a netlist and identifying every output node.

16. The method as defined in claim 12, wherein the step of evaluating an element along the identified pull-down path includes the step of evaluating a database having characteristics of a given element stored therein.

17. A computer readable storage medium containing program code for identifying NFETs in a pull-up path comprising:
    a first code segment configured to identify an output node in a netlist file;
    a second code segment configured to identify a channel-path extending between the output node and a positive supply as a pull-up path;
    a third code segment configured to evaluate an element along the identified pull-up path to determine whether the element is an NFET; and
    a fourth code segment configured to generate an error message, if the element is identified as an NFET is not channel connected to an interstitial pre-charge node.

18. The computer readable storage medium as defined in claim 17, wherein the step of generating an error message further includes the step of identifying a NFET as a NFET that is channel-connected to an interstitial pre-charge node.

19. The computer readable storage medium as defined in claim 17, further including the step of identifying an interstitial pre-charge node.

20. The computer readable storage medium as defined in claim 17, wherein the step of identifying an interstitial pre-charge node further includes the step of identifying a plurality of channel-connected NFETs extending between the output node and ground.

21. The method as defined in claim 1, wherein identifying a channel-path extending between the output node and a positive supply as a pull-up path is repeated for all channel-paths, evaluating an element along the identified pull-up path to determine whether the element is an NFET is repeated for every element along each of the identified pull-up paths, and generating an error message, if the element is identified as an NFET that is not channel connected to an interstitial pre-charge node, is performed for any identified NFET that is not channel connected to an interstitial pre-charge node.

22. The method as defined in claim 12, wherein identifying a channel-path extending between the output node and a negative supply as a pull-down path is repeated for all channel-paths, evaluating an element along the identified pull-down path to determine whether the element is a PFET is repeated for every element along each of the identified pull-down paths, and generating an error message, if the element is identified as a PFET, is performed for any identified PFET.

23. The computer readable storage medium as defined in claim 17, wherein the second code segment is configured to identify all channel-paths extending between the output node and a positive supply as pull-up paths, the third code segment is configured to evaluate every element along each of the identified pull-up paths to determine whether each element is an NFET, and the fourth code segment is configured to generate an error message for any element identified as an NFET that is not channel connected to an interstitial pre-charge node.

24. A computer readable storage medium containing program code for identifying PFETs in a pull-down path comprising:
    a first code segment configured to identify an output node in a netlist file;
    a second code segment configured to identify a channel-path extending between the output node and a negative supply as a pull-down path;
    a third code segment configured to evaluate an element along the identified pull-down path to determine whether the element is an PFET; and
    a fourth code segment configured to generate an error message, if the element is identified as a PFET.

25. The computer readable storage medium as defined in claim 24, wherein the second code segment is configured to identify all channel-paths extending between the output node and a negative supply as pull-down paths, the third code segment is configured to evaluate every element along each of the identified pull-down paths to determine whether each element is a PFET, and the fourth code segment is configured to generate an error message for any element identified as a PFET.

* * * * *

UNITED STATES PATENT AND TRADEMARK OFFICE
CERTIFICATE OF CORRECTION

PATENT NO. : 6,301,691 B1
DATED : October 9, 2001
INVENTOR(S) : McBride

It is certified that error appears in the above-identified patent and that said Letters Patent is hereby corrected as shown below:

<u>Column 5,</u>
Line 51, delete ""compute"" and insert therefor -- "computer" --

<u>Column 12,</u>
Line 59, delete "and" and insert therefor -- an --

<u>Column 15,</u>
Line 25, delete "heart" and insert therefor -- art --

<u>Column 17,</u>
Line 14, before "NFET" delete "the"
Line 17, delete "defined as the" and insert therefor -- identified as an --

Signed and Sealed this

Second Day of December, 2003

JAMES E. ROGAN
*Director of the United States Patent and Trademark Office*